US008120956B2

United States Patent
Wu et al.

(10) Patent No.: US 8,120,956 B2
(45) Date of Patent: Feb. 21, 2012

(54) SINGLE-TRANSISTOR EEPROM ARRAY AND OPERATION METHODS

(75) Inventors: Chun-Pei Wu, Nantou (TW); Chia-Ta Shieh, Tainan (TW); Chih-Wei Hung, Hsin-Chu (TW); Mars Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 182 days.

(21) Appl. No.: 12/708,725

(22) Filed: Feb. 19, 2010

(65) Prior Publication Data

US 2010/0290284 A1 Nov. 18, 2010

Related U.S. Application Data

(60) Provisional application No. 61/177,545, filed on May 12, 2009.

(51) Int. Cl.
*G11C 16/04* (2006.01)
(52) U.S. Cl. ..................................... 365/185.05; 365/63
(58) Field of Classification Search ............. 365/185.05, 365/63
See application file for complete search history.

(56) References Cited

U.S. PATENT DOCUMENTS

| 4,949,309 | A | 8/1990 | Rao |
| 5,097,444 | A | 3/1992 | Fong |
| 5,355,347 | A | 10/1994 | Cioaca |
| 5,717,636 | A * | 2/1998 | Dallabora et al. ........ 365/185.13 |
| 6,144,584 | A * | 11/2000 | Kunori et al. ............ 365/185.18 |
| 6,552,387 | B1 | 4/2003 | Eitan |
| 7,233,526 | B2 * | 6/2007 | Umezawa ................ 365/185.27 |
| 2008/0285326 | A1 * | 11/2008 | Alami et al. .................... 365/72 |
| 2009/0268525 | A1 * | 10/2009 | Ueda ........................ 365/185.18 |
| 2011/0157972 | A1 * | 6/2011 | Pasotti et al. .............. 365/185.1 |

* cited by examiner

*Primary Examiner* — Tuan T. Nguyen
(74) *Attorney, Agent, or Firm* — Slater & Matsil, L.L.P.

(57) ABSTRACT

An integrated circuit structure includes an electrically erasable programmable read-only memory (EEPROM) array, which includes EEPROM cells arranged as rows and columns; a plurality of word-lines and a plurality of drain-lines extending in a column direction, and a plurality of source-lines extending in a row direction. Each of the plurality of word-lines is connected to control gates of the EEPROM cells in a same column. Each of the plurality of drain-lines is connected to drains of the EEPROM cells in a same column, wherein none of the plurality of drain-lines are shared by neighboring columns of the EEPROM cells. Each of the plurality of source-lines is connected to sources of the EEPROM cells in a same row.

19 Claims, 7 Drawing Sheets

SINGLE-TRANSISTOR EEPROM ARRAY AND OPERATION METHODS

This application claims the benefit of U.S. Provisional Application No. 61/177,545 filed on May 12, 2009, entitled "Single-Transistor EEPROM Array and Operation Methods," which application is hereby incorporated herein by reference.

TECHNICAL FIELD

This invention relates generally to integrated circuit devices, and more particularly to memory cells, and even more particularly to design and operation methods of electrically erasable programmable read-only memories (EEPROMs).

BACKGROUND

Electrically erasable programmable read-only memory (EEPROM) has been widely used as the storage device in integrated circuits. There are various types of EEPROMs and corresponding memory cells. FIG. 1 illustrates a portion of a conventional EEPROM array 100, which includes a plurality of memory cells arranged in rows and columns. Word-lines (denoted as CG) and assistance gates AG are parallel to each other and form transistors with the underlying diffusion regions (including the denoted drains and sources). The drains of EEPROM cells in a same row are interconnected through metal lines (not shown), while the drains in different rows are disconnected from each other. Sources are interconnected through source-lines, which include diffusion regions extending in the column direction. The source-lines of the entire EEPROM array 100 are interconnected. Each of the memory cells in EEPROM array 100, for example, cell 102, includes two MOS devices, selection device 110 and storage device 112. Accordingly, each of the EEPROM cells occupies a relatively great chip area.

On the other hand, there are other types of EEPROM cells occupying less chip area, for example, the EEPROM cells comprising split gates. Although split-gate EEPROM cells are small, they typically include two polys, with one of the polys being used as a floating gate, and the other being used as a control gate. This type of EEPROM cell also suffers from drawbacks. Due to the extra poly, the manufacturing process is not compatible with the formation processes of logic MOS devices, which are single-poly devices. In addition, high program voltages, for example, about 10 volts, are needed, which require additional high-voltage devices to provide the high voltages.

Accordingly, what is needed in the art are EEPROM cells and the respective arrays that may be formed using logic-compatible processes and can be operated under low operation voltages.

SUMMARY OF THE INVENTION

In accordance with one aspect of the present invention, an integrated circuit structure includes an electrically erasable programmable read-only memory (EEPROM) array, which includes EEPROM cells arranged in rows and columns; a plurality of word-lines and a plurality of drain-lines extending in a column direction, and a plurality of source-lines extending in a row direction. Each of the plurality of word-lines is connected to control gates of the EEPROM cells in a same column. Each of the plurality of drain-lines is connected to drains of the EEPROM cells in a same column, wherein none of the plurality of drain-lines are shared by neighboring columns of the EEPROM cells. Each of the plurality of source-lines is connected to sources of the EEPROM cells in a same row.

In accordance with another aspect of the present invention, an integrated circuit structure includes an electrically erasable programmable read-only memory (EEPROM) array with EEPROM cells. A first column of the EEPROM cells includes a first drain-line connected to all drains of the first column of the EEPROM cells; and a first word-line connected to all control gates of the first column of the EEPROM cells. A second column of the EEPROM cells includes a second drain-line connected to all drains of the second column of the EEPROM cells; and a second word-line connected to all control gates of the second column of the EEPROM cells. The first column of the EEPROM cells and the second column of the EEPROM cells share common sources. Sources of the EEPROM cells in different rows of the EEPROM array are disconnected from each other. A third column of the EEPROM cells is immediately neighboring the first column of the EEPROM cells. The third column of the EEPROM cells includes a third drain-line connected to all drains of the third column of the EEPROM cells. The third drain-line is parallel to, and disconnected from, the first drain-line and the second drain-line.

The advantageous features of the present invention include logic-compatible processes capable of low operation voltages and reduced leakages.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

An electrically erasable programmable read-only memory (EEPROM) array is provided. The variations and the operations of the embodiment are then discussed. Throughout the various views and illustrative embodiments of the present invention, like reference numbers are used to designate like elements.

Figure 1:
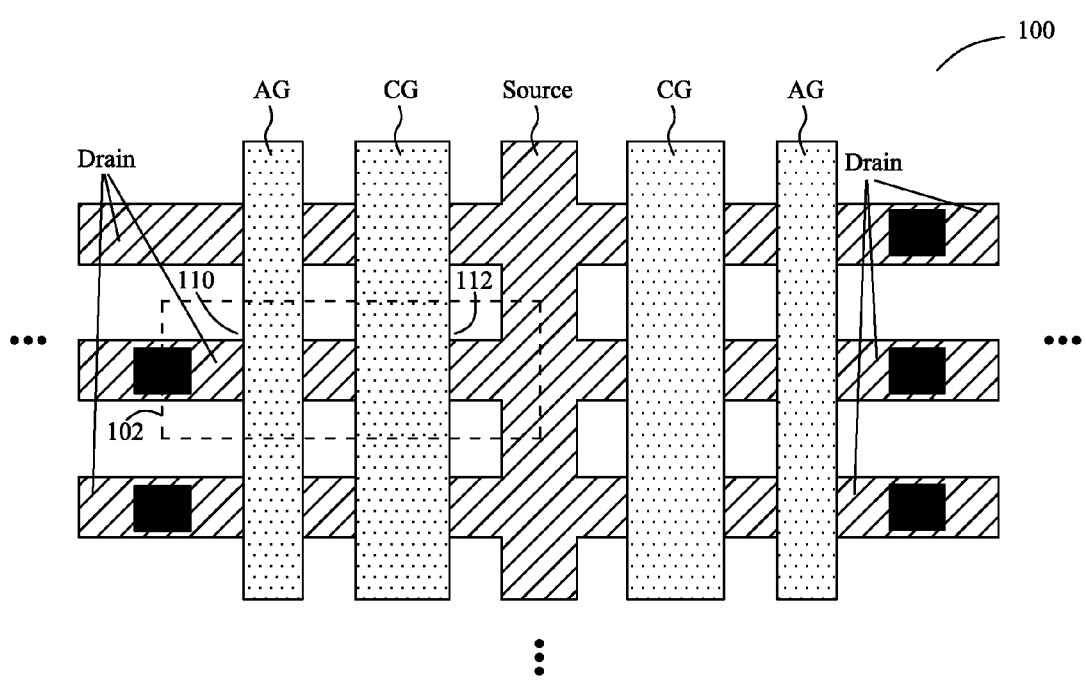
FIG. 1 illustrates a conventional electrically erasable programmable read-only memory (EEPROM) array, wherein each of the EEPROM cells in the EEPROM array includes two MOS devices.
Figure 2A:
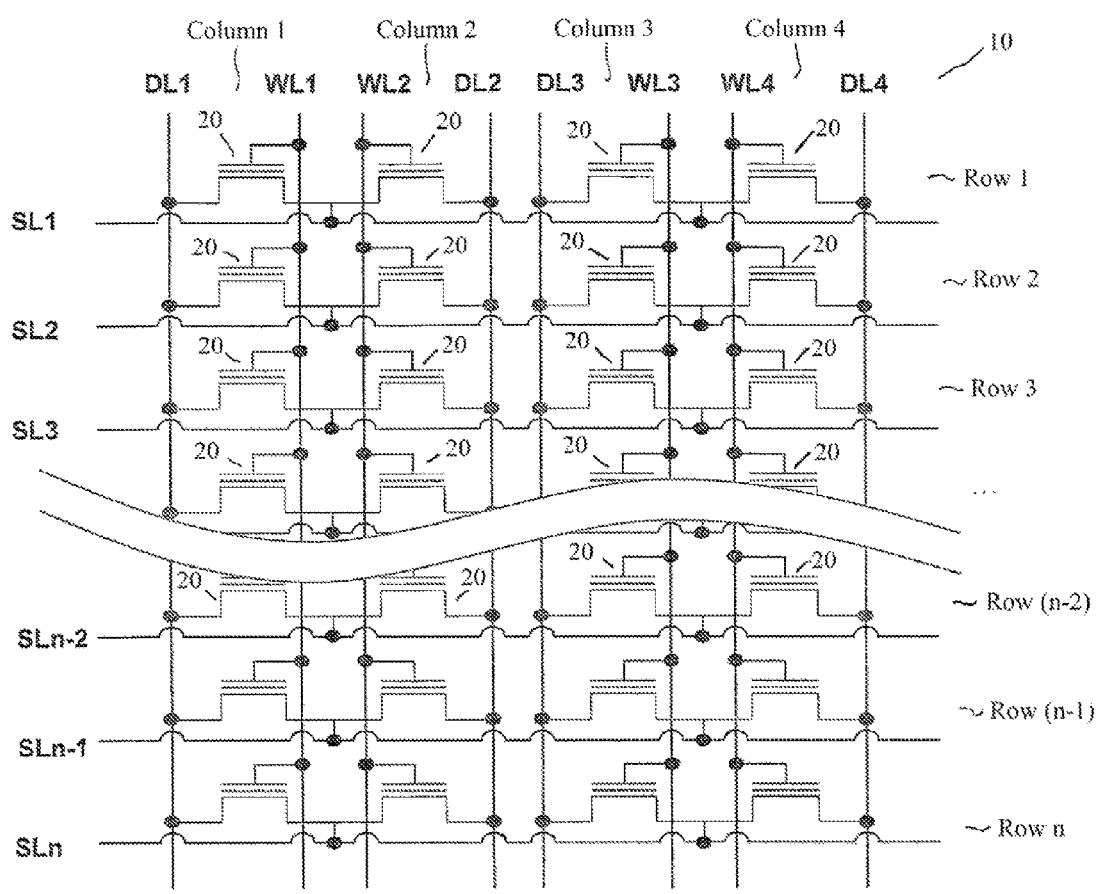
FIG. 2A illustrates an EEPROM array.

FIG. 2A illustrates a circuit diagram of EEPROM array 10, which includes a plurality of EEPROM cells 20 arranged in rows (denoted as Row 1, Row 2, and the like) and columns (denoted as Column 1, Column 2, and the like). EEPROM array 10 includes a plurality of word-lines WL (denoted as WL1, WL2, and the like, also referred to as control lines) extending in a column direction, a plurality of drain-lines DL (denoted as DL1, DL2, and the like) extending in the column direction, and a plurality of source-lines SL (denoted as SL1, SL2, and the like, also referred to as bit-lines) extending in a row direction. It is realized, however, that the term "row" and "column" are interchangeable, depending on the direction from which EEPROM array 10 is viewed. Each EEPROM cell 20 includes a drain connected to a respective drain-line DL, a source connected to a respective source-line SL, and a control gate connected to a respective word-line WL. The structure of EEPROM cells 20 is shown in detail in FIG. 3, which will be discussed in detail in subsequent paragraphs. For the simplicity of discussion, throughout the description, an EEPROM cell 20 selected for a program operation, an erase operation, or a read operation is referred to as a selected cell, and the row and the column of the selected cell are referred to as a selected row and a selected column, respectively. The remaining ones of the cells, rows, and columns are referred to as unselected cells, unselected rows, and unselected columns, respectively.

In an embodiment, drain-lines DL are disconnected from each other, source-lines SL are disconnected from each other, and word-lines WL are disconnected from each other. None of the drain-lines DL are shared by neighboring columns. Accordingly, in EEPROM array 10, the total number of drain-lines DL is equal to the total number of word-lines WL. When an EEPROM cell is selected for a program operation, an erase operation, or a read operation, the leakage currents of the unselected cells in the selected rows and the selected columns may be reduced by applying appropriate voltages. Further, with neighboring drain-lines DL (for example, drain-lines DL2 and DL3) disconnected from each other, individual cells can be programmed without programming the neighboring cell. In an embodiment, each drain-line DL extends all the way through the entire column. In alternative embodiments, EEPROM array 10 may be divided into a plurality of sectors, with each of the sectors including some, but not all, of the rows of EEPROM 10. Accordingly, each drain-line DL may be divided into a plurality of portions disconnected from each other, while each of the portions connects drains of all EEPROM cells 20 in the same column and the same sector.

Figure 2B:
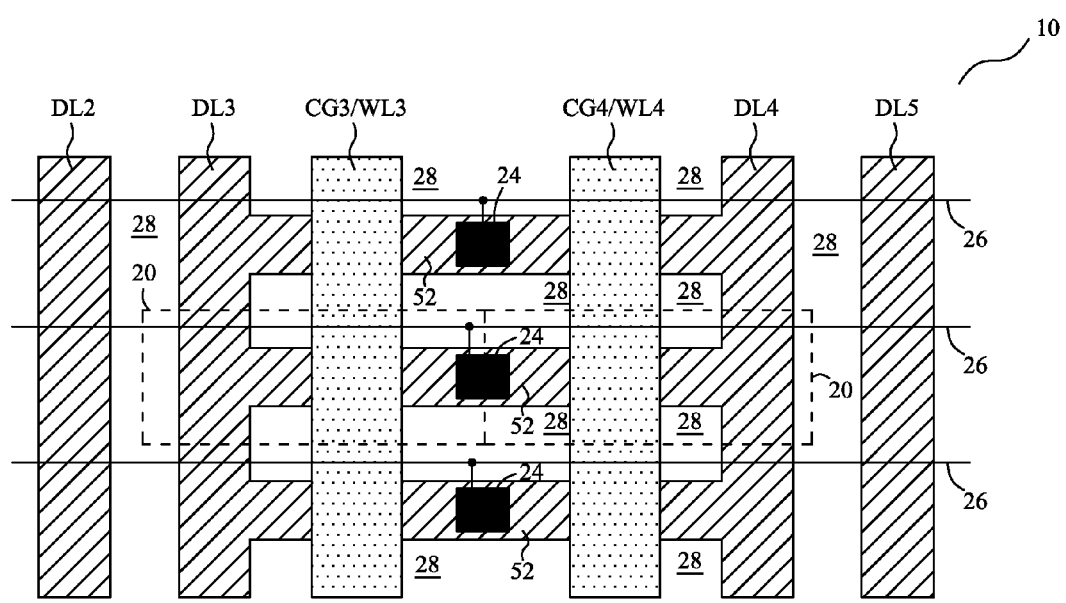
FIG. 2B illustrates an exemplary layout of a portion of the EEPROM array as shown in FIG. 2A.

FIG. 2B illustrates an exemplary layout of a portion of EEPROM array 10, which shows that drain-lines DL2 and DL3 include separate diffusion regions. The drain-lines in immediately neighboring columns, for example, drain-lines DL2 and DL3, may be separated from each other by insulation regions 28 in the respective substrate, wherein insulation regions 28 may be shallow trench isolation (STI) regions. Each source 52 is shared by two neighboring EEPROM cells 20 in the same row. Through contact plugs 24, source 52 of one EEPROM cell 20 may be connected to sources 52 of all other EEPROM cells 20 in the same row (not shown in FIG. 2B, please refer to 2A), for example, through metal lines 26 as illustrated in FIG. 2B. It is observed that the size of each EEPROM cell 20 may be very small since it only occupies the size of one transistor.

Table 1 illustrates exemplary operation voltages (volts) for operating EEPROM array 10. It is noted that the voltages listed in Table 1 are merely examples, and may change with the change of operation mechanisms and the technology generation of EEPROM array 10.

TABLE 1

| Operation Condition | Selected Cell | | | Un-Selected Cell | | | P-Well |
|---|---|---|---|---|---|---|---|
| | WL | Drain | BL (SL) | WL | Drain | BL (SL) | |
| Program | 9 | 0 | 4.5 | 0 | 0 | 0 | 0 |
| Program (Low Voltage) | 6 | −3 | 1.5 | −3 | −3 | −3 | −3 |
| Erase | −6 | F | 5 | F | F | 0 | 0 |
| Read | 3 | 1.1 | 0 | 0 | 0 | 0 | 0 |

"F" indicates floating.

Figure 3:
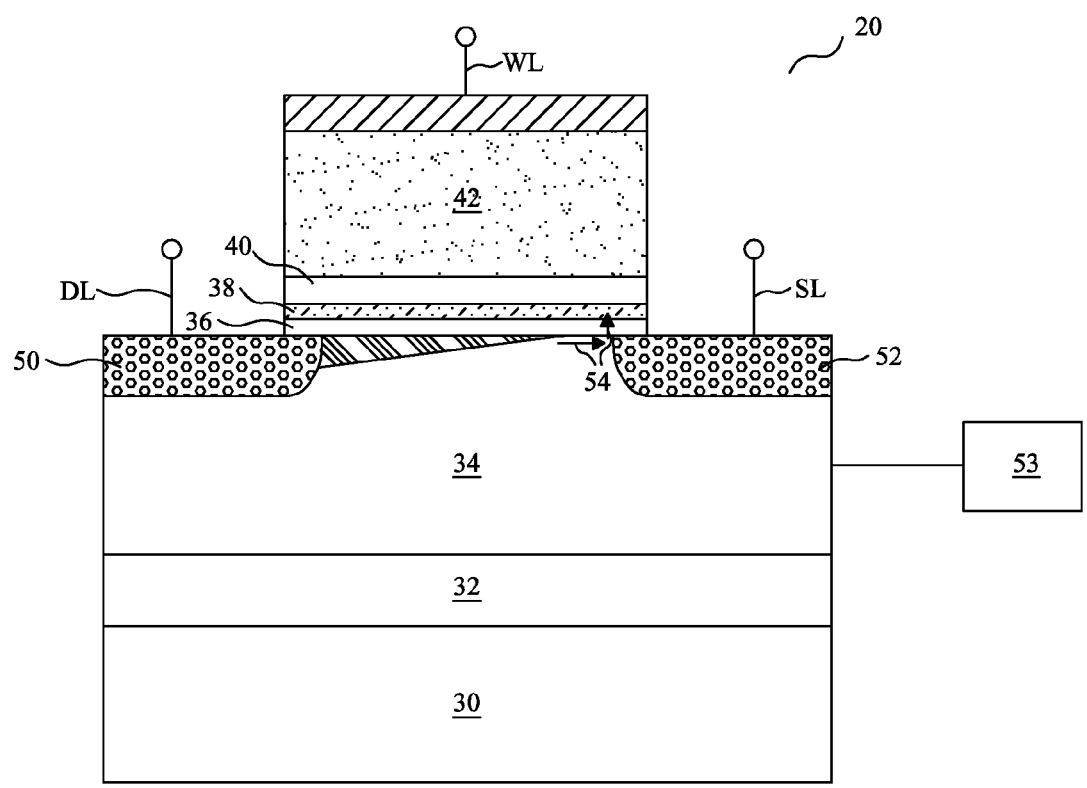
FIG. 3 illustrates a cross-sectional view of an EEPROM cell in a program operation.

The operation of EEPROM cells 20 may be explained referring to FIGS. 3 through 5B. FIG. 3 illustrates a cross-sectional view of EEPROM cell 20, which includes stacked layers including tunneling layer 36, storage layer 38, blocking layer 40, and control gate 42. Control gate 42 is connected to one of word-lines WL as shown in FIG. 2A. EEPROM cell 20 further includes drain 50 and source 52, wherein drain 50 is connected to one of drain-lines DL (please refer to FIG. 2A), and source 52 is connected to one of source-lines SL. In an embodiment, storage layer 38 is formed of a dielectric material having a high trap density, for example, silicon nitride. By using dielectric materials to form EEPROM cells 20, only one polysilicon layer (control gate 42) needs to be formed, and hence the formation process of EEPROM cells 20 is compatible with the formation of logic MOS transistors. In an exemplary formation process, layers 36, 38, and 40 may be formed prior to the formation of the gate dielectrics and the gate electrodes of logic MOS transistors. The gate dielectrics and the gate electrodes may then be formed in logic regions, and simultaneously formed over layers 36, 38 and 40 to finish the formation of gate stacks of both logic MOS transistors and EEPROM cells 20.

EEPROM cell 20 is formed in P-well 34, which may be electrically insulated from P-type substrate 30 by deep N-well (DNW) 32. In an embodiment, P-well 34 of each EEPROM cell 20 is separated from P-wells 34 of other EEPROM cells 20 by N-well regions (not shown) and/or shallow trench isolation (STI) regions (refer to FIG. 2B). In alternative embodiments, P-wells 34 of all EEPROM cells 20 in EEPROM array 10 are interconnected. The threshold voltage Vt of EEPROM cells 20 may be adjusted by implanting P-wells 34, which implantation may be performed using the same mask used for forming DNW 32. In the implantation, additional P-type impurities may be implanted to P-well region 34 to increase the threshold voltage Vt of EEPROM cell 20.

Referring again to FIG. 3, in a program operation, control gate 42 (and the respective word-line WL as shown in FIG. 2A) of a selected EEPROM cell 20 is applied with about 9V, drain 50 (and the respective drain-line DL) is applied with an electrical ground voltage (0V), and source 52 (and the respective source-line SL) is applied with about 4.5V. Accordingly, electrons move from drain 50 to source 52. Hot electrons are hence generated, particularly when they are near source 52, as symbolized by arrows 54, and are programmed to storage layer 38. If storage layer 38 is formed of a dielectric material, electrons are mainly programmed to the source side of storage layer 38. P-well 34 may be applied with 0V, and DNW 32 may also be applied with 0V. The un-selected EEPROM cells 20 in array 10 as shown in FIG. 2A may all be applied with 0V to the respective control gates 42, drains 50, and sources 52. Again, P-well 34 may be applied with 0V, and DNW 32 may be applied with 0V.

In alternative embodiments, the high voltage applied to control gate 42 may be shared by control gate 42 and P-well 34. Accordingly, as shown in Table 1, control gate 42 is applied with about 6V, P-well 34 is applied with about −3V, while source 52 is applied with about 1.5V. As a result, the voltage difference between control gate 42 and P-well 34 is still about 9V, and the voltage difference between source 52 and P-well 34 is still about 4.5V. By using this scheme, the high voltage that otherwise would be needed is reduced to a low positive voltage and a low negative voltage, so that high-voltage devices for providing the high voltages are no longer needed. The negative voltage may be provided by negative power supply source 53, which may be configured to provide the negative voltage and the ground voltage.

Figure 4:
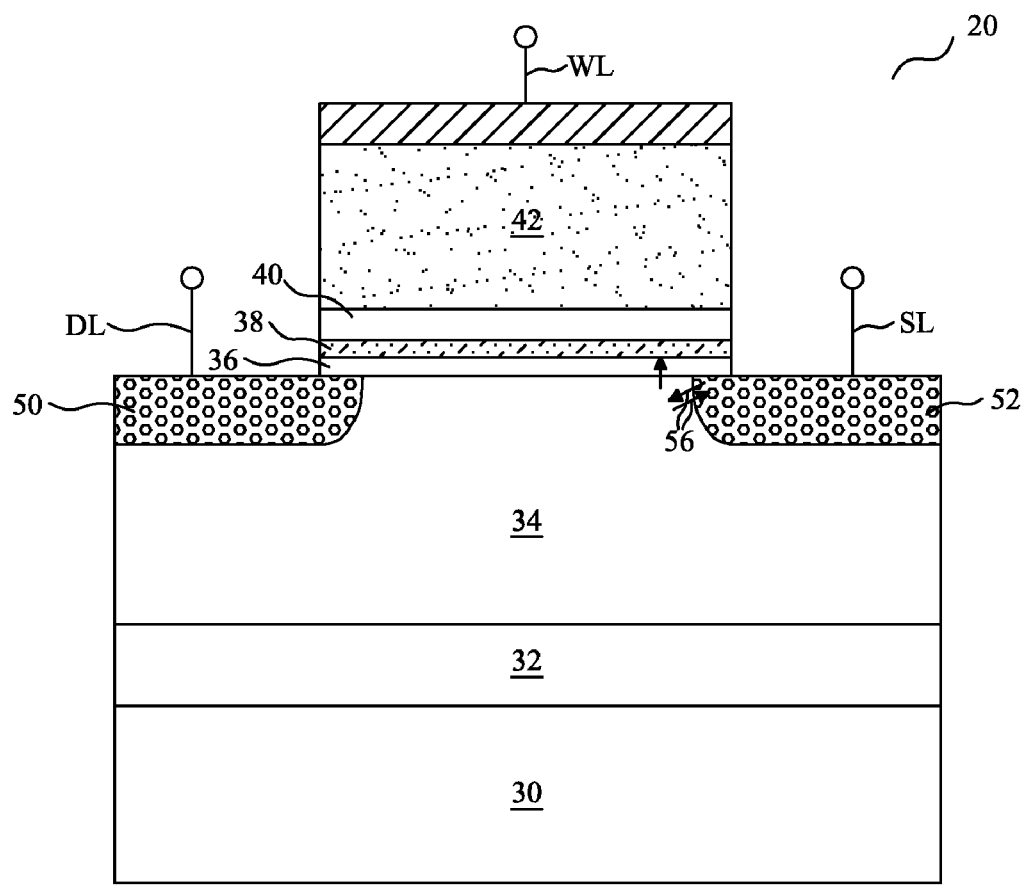
FIG. 4 illustrates a cross-sectional view of an EEPROM cell in an erase operation.

FIG. 4 illustrates EEPROM cell 20 in an erase operation. In an embodiment, as also illustrated in Table 1, control gate 42 (and the respective word-line WL as shown in FIG. 2A) of a selected EEPROM cell 20 is applied with about −6V, drain 50 (and the respective drain-line DL) is floating, and source 52 (and the respective source-line BL) is applied with about 5V. P-well 34 and DNW 32 are applied with 0V. Accordingly, electron-hole pairs (symbolized by arrows 56) are generated on the source side of P-well 34, and then the holes are pushed into storage layer 38. The electrons in storage layer 38 are hence neutralized by the holes. The respective mechanism is a band-to-band hole erase.

Figure 5A:
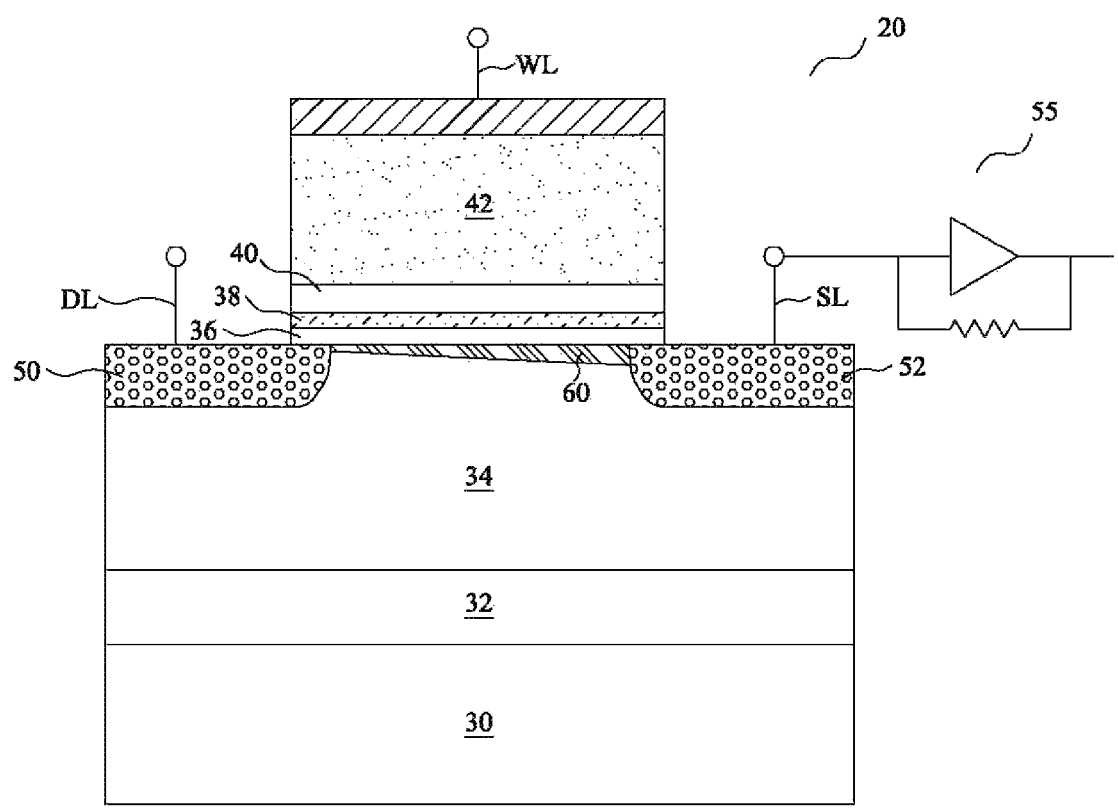
FIGS. 5A and 5B illustrate cross-sectional views of an EEPROM cell in read operations.
Figure 5B:
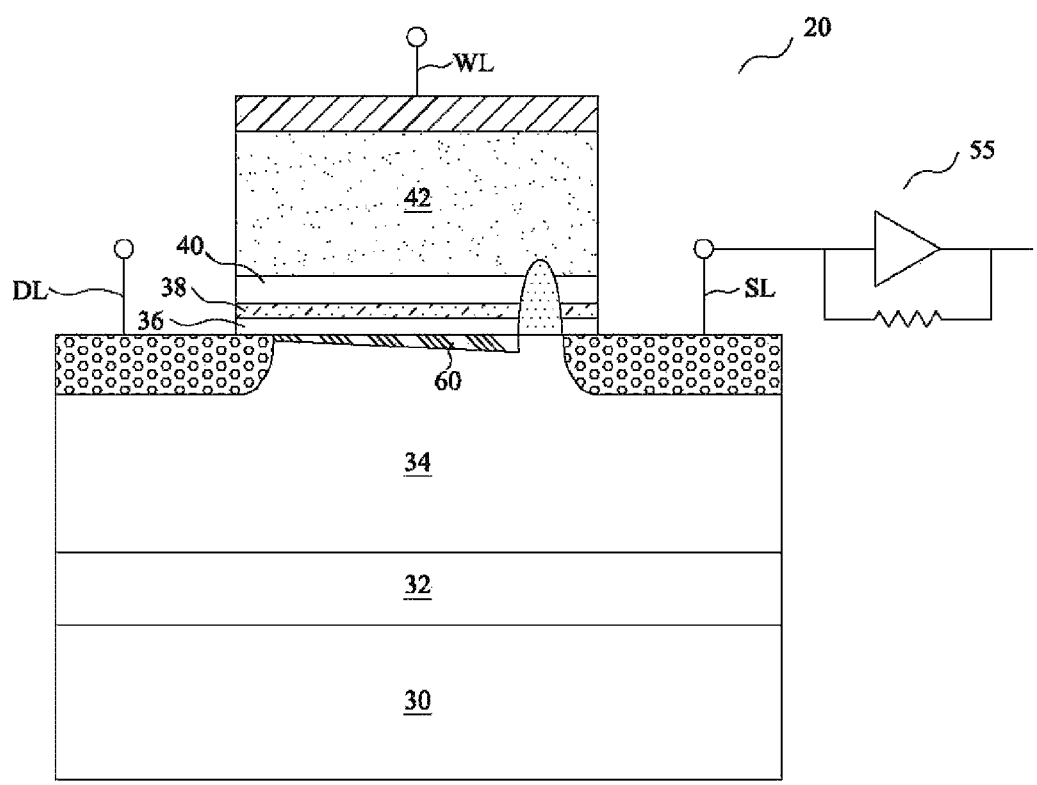

FIGS. 5A and 5B illustrate EEPROM cell 20 in read operations, wherein FIG. 5A illustrates the reaction of EEPROM cell 20 in the erased state, while FIG. 5B illustrates the reaction of EEPROM cell 20 in the programmed state. In a read operation, as also illustrated in Table 1, control gate 42 (and the respective word-line WL as shown in FIG. 2A) of a selected EEPROM cell 20 is applied with about 3V, drain 50 (and the respective drain-line DL) is applied with about 1.1V, and source 52 (and the respective source-line BL) is applied with about 0V. P-well 34 and DNW 32 are applied with 0V. Since drain 50 is applied with a higher voltage than source 52, the read operation is a reverse read operation due to the fact that the read is from the side opposite to the side (source side) on which charges are programmed. With electrons erased from storage layer 38, inversion layer 60 may be formed, and the respective source-drain current is high.

Referring to FIG. 5B, if EEPROM cell 20 is programmed, due to the electrons stored on the source side of storage layer 38, inversion layer 60 is broken, and the respective source-drain current, if any, is small. It is observed that due to the reverse read and localized storage charges, the respective EEPROM cell 20 is more resistive to the read error caused by over-erase, since even if the over-erase occurs on the source side, the portions of storage layer 38 closer to the drain side can still successfully turn off the source-drain current on un-selected cells. The read window is thus enlarged. In an embodiment, the source-drain current is sensed on the source side, so that the noise that comes from the other cells sharing a common drain with the selected cells is reduced. FIGS. 5A and 5B schematically illustrate exemplary current-sensing devices 55, which may be connected to source-lines SL.

The embodiments of the present invention have several advantageous features. Due to the fact that EEPROM array 10 has separate sources between rows and separate drains between columns, EEPROM cells do not require selection transistors, and hence the sizes of the respective EEPROM cells may be reduced. On the other hand, the EEPROM cells may include dielectric storage layers, and hence only one polysilicon layer is formed, making the formation of EEPROM cells compatible with the formation of logic devices. The use of the dielectric storage layers further makes the EEPROM cells more resistive to over-erase, and hence the read window is enlarged.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
    an electrically erasable programmable read-only memory (EEPROM) array comprising:
        EEPROM cells arranged in rows and columns;
        a plurality of word-lines extending in a column direction, wherein each of the plurality of word-lines is connected to control gates of the EEPROM cells in a same column;
        a plurality of drain-lines extending in the column direction, wherein each of the plurality of drain-lines is connected to drains of the EEPROM cells in a same column, and wherein none of the plurality of drain-lines are shared by neighboring columns of the EEPROM cells; and
        a plurality of source-lines extending in a row direction, wherein each of the plurality of source-lines is connected to sources of the EEPROM cells in a same row.

2. The integrated circuit structure of claim 1, wherein the EEPROM cells are single-transistor cells.

3. The integrated circuit structure of claim 1, wherein each of the plurality of drain-lines comprises a diffusion region extending in the column direction and crossing a plurality of rows of the EEPROM array.

4. The integrated circuit structure of claim 3, wherein the diffusion region crosses all rows of the EEPROM array.

5. The integrated circuit structure of claim 1, wherein the source-lines in different rows are disconnected from each other.

6. The integrated circuit structure of claim 1, wherein each of the EEPROM cells comprises:
    a P-type substrate;
    an N-well over the substrate;
    a P-well over the N-well;
    a tunneling layer over the P-well;
    a dielectric storage layer over the tunneling layer;
    a blocking layer over the dielectric storage layer; and
    a control gate over the blocking layer and connected to one of the plurality of word-lines.

7. The integrated circuit structure of claim 6 further comprising a negative voltage source connected to the P-well, wherein the negative voltage source is configured to provide a negative voltage.

8. The integrated circuit structure of claim 7, wherein the negative voltage source is further configured to provide a ground voltage.

9. An integrated circuit structure comprising:
a first column of electrically erasable programmable read-only memory (EEPROM) cells in an EEPROM array, the first column of EEPROM cells comprising:
   a first drain-line connected to all drains of the first column of EEPROM cells; and
   a first word-line connected to all control gates of the first column of EEPROM cells;
a second column of EEPROM cells in the EEPROM array, the second column of EEPROM cells comprising:
   a second drain-line connected to all drains of the second column of EEPROM cells; and
   a second word-line connected to all control gates of the second column of EEPROM cells, wherein the first column of EEPROM cells and the second column of EEPROM cells share common sources, and wherein sources of the EEPROM cells in different rows of the EEPROM array are disconnected from each other; and
a third column of EEPROM cells in the EEPROM array, the third column of EEPROM cells immediately neighboring the first column of EEPROM cells, wherein the third column of EEPROM cells comprises a third drain-line connected to all drains of the third column of EEPROM cells, and wherein the third drain-line is parallel to, and disconnected from, the first drain-line and the second drain-line.

10. The integrated circuit structure of claim 9 further comprising an insulation region between and adjoining the first drain-line and the third drain-line.

11. The integrated circuit structure of claim 9, wherein the sources of all EEPROM cells in a same row of the EEPROM array are connected to a same source-line.

12. The integrated circuit structure of claim 11 further comprising a current-sensing device connected to the source-line.

13. The integrated circuit structure of claim 9, wherein a total number of drain-lines in the EEPROM array is equal to a total number of word-lines in the EEPROM array.

14. The integrated circuit structure of claim 9, wherein the first drain-line, the second drain-line, and the third drain-line extend crossing all rows of the EEPROM array.

15. The integrated circuit structure of claim 9, wherein each of the first drain-line, the second drain-line, and the third drain-line comprises a continuous diffusion region extending throughout a plurality of rows of the EEPROM array.

16. An integrated circuit structure comprising:
an electrically erasable programmable read-only memory (EEPROM) array comprising:
   EEPROM cells arranged in rows and columns, wherein each of the EEPROM cells is a single-transistor cell comprising:
      a storage layer formed of a dielectric material;
      a control gate over and electrically disconnected from the storage layer;
      a drain adjacent to the storage layer and the control gate; and
      a source adjacent to the storage layer and the control gate;
   a plurality of word-lines extending in a column direction, wherein each of the plurality of word-lines is connected to the control gates of the EEPROM cells in a same column;
   a plurality of drain-lines extending in the column direction, wherein each of the plurality of drain-lines is connected to the drains of the EEPROM cells in a same column, and wherein a total number of drain-lines in the EEPROM array is equal to a total number of word-lines in the EEPROM array; and
   a plurality of source-lines extending in a row direction and disconnected from each other, wherein each of the plurality of source-lines is connected to the sources of the EEPROM cells in a same row.

17. The integrated circuit structure of claim 16, wherein two of the EEPROM cells in a same row and immediately next to each other share a common source.

18. The integrated circuit structure of claim 16, wherein each of the EEPROM cells further comprises an N-well and a P-well over the N-well, and wherein the integrated circuit structure further comprises a power supply source connected to the sources of the EEPROM cells, wherein the power supply source is configured to provide a negative voltage and a ground voltage.

19. The integrated circuit structure of claim 16, wherein each of the EEPROM cells further comprises a dielectric storage layer.

* * * * *